United States Patent [19]

Hokanson et al.

[11] Patent Number: 4,873,566

[45] Date of Patent: Oct. 10, 1989

[54] MULTILAYER CERAMIC LASER PACKAGE

[75] Inventors: John L. Hokanson, Upper Milford Township, Lehigh County; Palmer D. Smeltz, Jr., Ruscombmanor Township, Berks County; Katherine A. Yanushefski; Michael J. Yanushefski, both of Hanover Township, Northampton County; Craig A. Young, Nazareth, all of Pa.

[73] Assignees: American Telephone and Telegraph Company, Murray Hill; AT&T Bell Loboratories, AT&T Technologies Inc., Berkeley Heights, both of N.J.

[21] Appl. No.: 8,051

[22] Filed: Jan. 15, 1987

Related U.S. Application Data

[63] Continuation-in-part of Ser. No. 792,056, Oct. 28, 1985, abandoned.

[51] Int. Cl.[4] .................. H01L 23/02; H01L 23/12
[52] U.S. Cl. ........................................... 357/74
[58] Field of Search ............ 357/74, 75, 80, 81, 357/84, 71

[56] References Cited

U.S. PATENT DOCUMENTS

| | | | |
|---|---|---|---|
| 3,840,889 | 10/1974 | O'Brien et al. | 357/81 |
| 4,003,074 | 1/1977 | Yonezu et al. | 357/74 |
| 4,119,363 | 10/1978 | Camlibel et al. | 350/96.20 |
| 4,131,911 | 12/1978 | Fujine et al. | 357/74 |
| 4,144,504 | 3/1979 | Leggett et al. | 372/36 |
| 4,296,998 | 10/1981 | Duft | 350/96.20 |
| 4,309,717 | 1/1982 | Cardinal | 357/74 |
| 4,326,214 | 4/1982 | Trueblood | 357/80 |
| 4,399,541 | 8/1983 | Kovats et al. | 372/36 |
| 4,524,238 | 6/1985 | Butt | 357/81 |
| 4,577,214 | 3/1986 | Schaper | 357/74 |

OTHER PUBLICATIONS

"A Multilayer Ceramic ..." *IEEE Trans. Comp., Hybrids and Manuf. Tech.*, vol. CHMT-3, No. 4, 12/80, Blodgett Jr., pp. 634-637.

"Design of a Solid State Laser ..." *Int'l J. for Hybrid Microelec.* vol. 5, No. 2, 11/82, Spector, pp. 172-174.

"Optics for Microwave Applications" 1985 *IEEE MTT-S Int'l. Microwave Symp.*, 6/85, Wahi, pp. 295-288.

*Primary Examiner*—William L. Sikes
*Assistant Examiner*—Robert E. Wise
*Attorney, Agent, or Firm*—W. W. Koba

[57] ABSTRACT

A multilayer ceramic package for optical devices is disclosed for use in both high and low bit rate applications. A side portion of the multilayer package is formed to provide a multilayer microwave input connection for a high bit rate signal. In an exemplary arrangement, an intermediate ceramic layer of the multilayer structure is defined with an appropriate thickness and metallized on areas of the top and bottom surfaces. This combination thus forms a multilayer microwave connection defined as a microstrip. Other multilayer configurations, for example, a stripline, may also be used. By utilizing a multilayer microwave connection in place of a conventional electrical connection, the impedance of the high frequency input source can be better matched to the optical device.

48 Claims, 5 Drawing Sheets

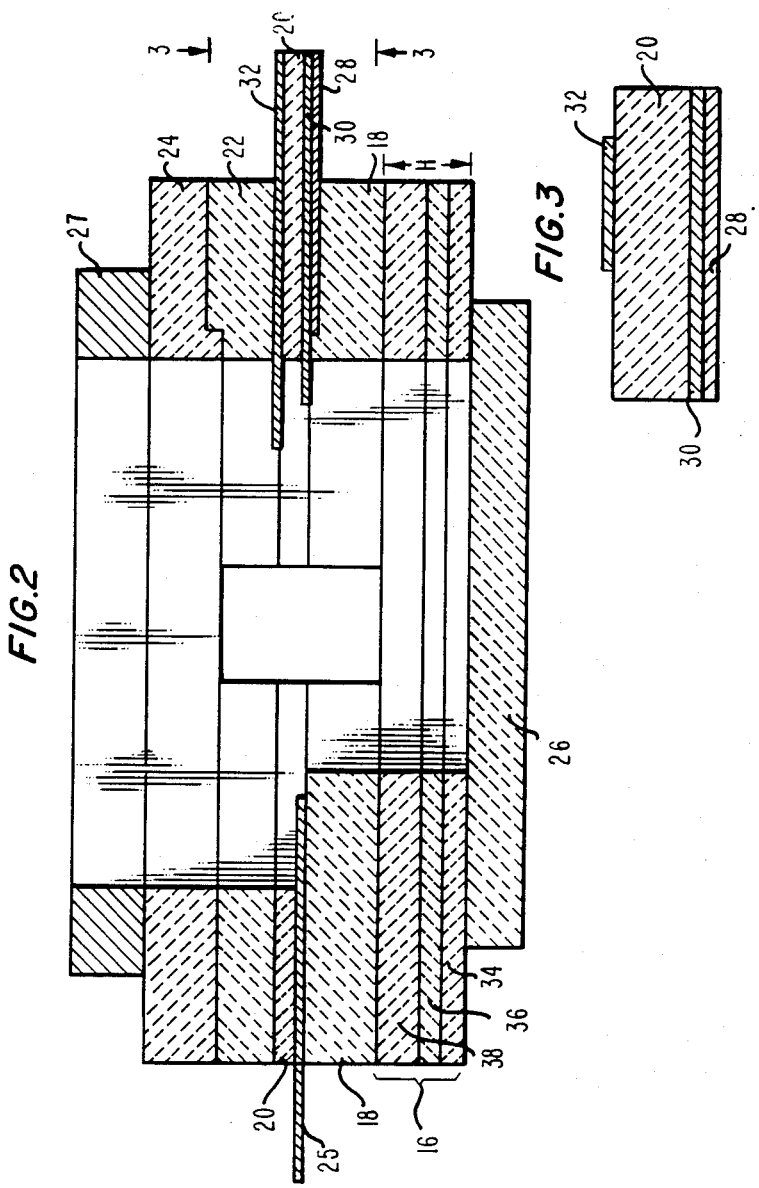

MULTILAYER CERAMIC LASER PACKAGE

This application is a continuation-in-part of application Ser. No. 792,056, filed October 28, 1985, now abandoned.

BACKGROUND OF THE INVENTION

1. Field of the Invention

The present invention relates to a laser package for high frequency applications and, more particularly, to a multilayer ceramic laser package which includes a multilayer microwave input connection capable of providing laser operation in the gigabit per second range.

2. Description of the Prior Art

Associated with the continuing developments in the field of optical communication systems is a need for improved packages to house the various optical devices. For example, optical systems as presently contemplated will contain active optical sources and detectors, both of which are expected to require a hermetic housing to protect the optical devices from attack by deleterious contaminants in the ambient, such as moisture in the atmosphere. Inasmuch as optical signals exit or enter the hermetic housing via optical fibers, some means to hermetically seal the fiber to the housing will be required. There exist many arrangements in the prior art which have been developed to provide these required hermetic packages. One exemplary arrangement is disclosed in Camlibel et al U.S. Pat. No. 4,119,363 issued on October 10, 1978. In the Camlibel et al arrangement, an optical fiber is hermetically sealed to a metal housing containing an optical device by threading and centering the fiber through a thin walled metal tube, filling the tube with solder and allowing it to cool. The solder, upon solidifying and cooling, squeezes against the fiber and forms a thermetic seal. The tube-fiber assembly is inserted through an aperture in the housing wall, the fiber is aligned with the optical device and then the tube is soldered to the wall. An alternative hermetic package for optical devices is disclosed in W. H. Dufft U.S. Pat. No. 4,296,998 issued on October 27, 1981. A metallic sealing cap is affixed to the body for hermetic sealing. The encapsulation is completed by evacuating the inner chamber and back-filling with nitrogen.

One factor used to measure advancement in the field of optical communication systems is the bit rate capability of the system. Continual increases in bit rate is an ever-present goal to optical system designers. As the bit rates exceed 500 Mb/s and approach the gigabit range, problems in providing the input signal to the laser with conventional electrical contacts develop. These conventional contacts begin to exhibit such a large parasitic inductance that it is not possible simply to connect a high bit rate signal source directly to the laser. Borrowing from microwave technology, a coaxial connection may be utilized in place of the electrical connection between the input source and the laser. R. E. Cardianl U.S. Pat. No. 4,309,717 issued on January 5, 1982 discloses such a coaxial input arrangement. As disclosed, a conventional coaxial line is inserted through a standard metal laser package, hermetically sealed in place, and connected to the laser. Although this arrangement solves the problem associated with standard electrical connections at high bit rates, the package itself is bulky, expensive and relatively difficult to manufacture.

An article entitled "Design of a Solid State Laser Hybrid Package" by M. Spector appearing in the *International Journal for Hybrid Microelectronics*, Vol. 5, No. 2, November 1982 at pp. 172–174 discusses in detail the technological challenges associated with package laser devices for high frequency applications. Dr. Spector describes in particular a new hybrid structure (the GTE TEC-PAC), which is a hermetic laser package of narrow design to keep the input electrical leads as short as possible, and thus reduce their associated parasitics. As discussed in the article, the limiting factor for the design is the overall width of the thermo-electric cooler mount of the laser device. Therefore, the lead lengths for this arrangement will eventually dictate a maximum input signal frequency. Futher, the continual re-design of this standard package to fit high frequency applications results in increasingly expensive packages. Thus, a need remains in the prior art for a laser package capable of accommodating optical transmission at high bit rates (on the order of 500 Mb/s to at least 5 Gb/s) which is rugged, inexpensive, versatile, and relatively simple to manufacture.

SUMMARY OF THE INVENTION

The problem remaining in the prior art has been solved in accordance with the present invention which relates to a laser package for high frequency applications and, more particularly, to a multilayer ceramic laser package which includes a multilayer microwave input connection providing laser operation in the gigabit/second range.

It is an aspect of the present invention to provide a versatile laser package which is capable of receiving both high and low bit rate input signals by including both a multilayer microwave, (referred to as microstrip), input and conventional electrical conductor inputs, formed by metallizing different portions of particular ceramic layers of the multilayer package. In particular, a microstrip input is formed by metallizing both the top and bottom of a specific ceramic layer, the ceramic layer being of a predetermined thickness. The bottom metallization defines the stripline ground plane and the top metallization, a relatively thick metal deposit, is the conductor. Since the ceramic is electrically nonconductive and has a known dielectric constant, the combination of the two metal layers sandwiching the ceramic layer forms the microstrip input. The low frequency input, as well as other necessary package connections (for example, those needed to power any other sensors or devices included in the package), are simply metallized on either another portion of the same layer or any other appropriate layer of the package.

Another aspect of the present invention is to provide a hermetic laser package, since as stated above most optical devices require protection from the environment. The multilayer ceramic package of the present invention may be fired at a temperature which is capable of sintering the ceramic and hermetically sealing the package body. Since the high bit rate microstrip input connection is part of the actual package, no additional steps need to be taken to provide a hermetic seal between the input connection and the package body. This is also true for the other various electrical connections to the package. A hermetic seal may also be made between the top and bottom covers of the package and the multilayer ceramic housing.

A further aspect of the present invention is to utilize a package material which provides a good match to any connected fiber in terms of its thermal coefficient of expansion.

Other and further aspects of the present invention will become apparent during the course of the following discussion and by reference to the accompanying drawings.

BRIEF DESCRIPTION OF THE DRAWINGS

Referring now to the drawings, where like numerals represent like parts in several views:

FIG. 2 is a cut-away view of the package of FIG. 1, taken along line 2—2 of FIG. 1, to illustrate the interrelationship of the dimensions of the various layers required to provide an opening for the connection of an optical fiber output, as well as the placement of the metallized portions required to form both the stripline input connection 1 and other various electrical connections;

FIG. 3 is an alternative view of the stripline input 1 formed in accordance with the present invention taken along line 3—3 of FIG. 2;

DETAILED DESCRIPTION

Figure 1:
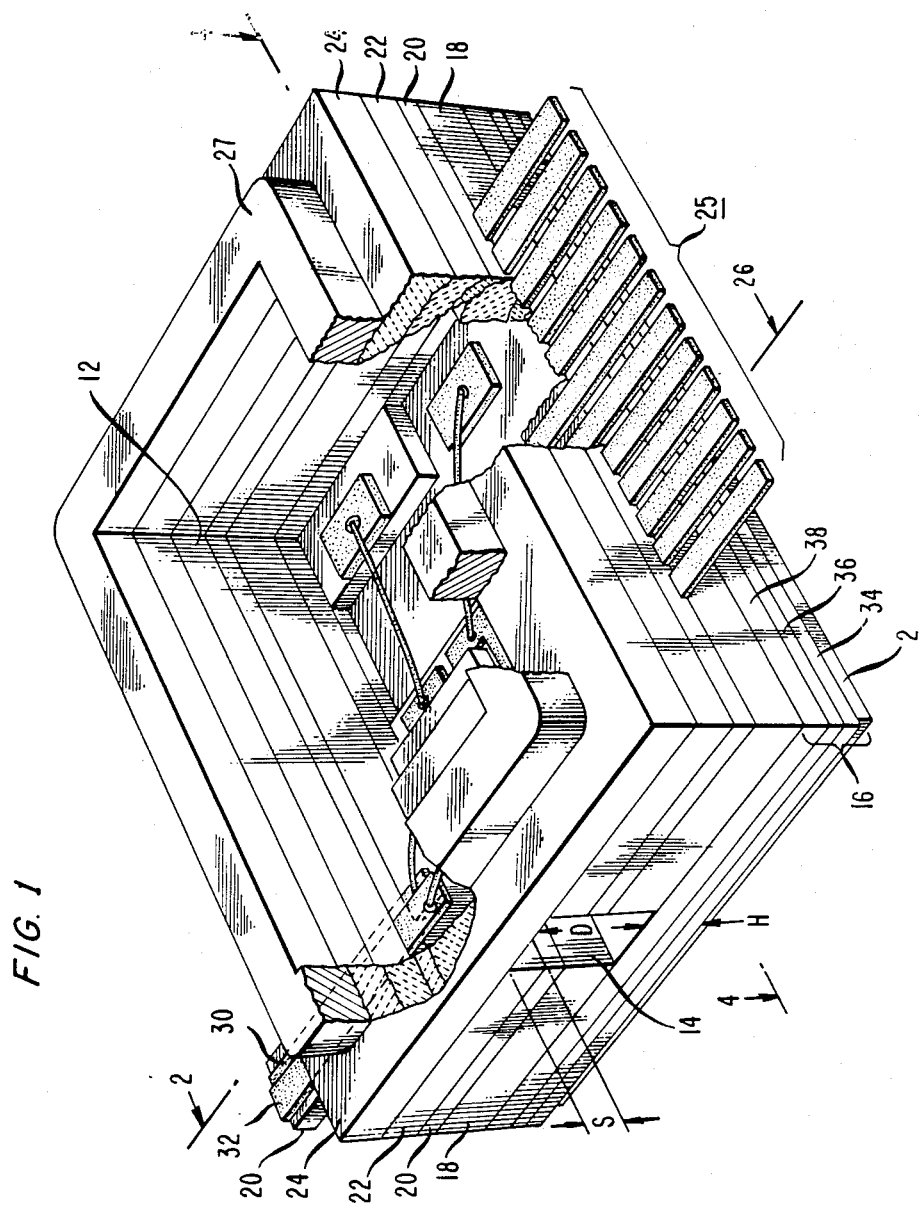
FIG. 1 is a view in perspective of a multilayer ceramic laser package formed in accordance with the present invention, which has the top sealing layer, or lid, removed to show the inner cavity of the package.

An exemplary multilayer ceramic package 10 formed in accordance with the present invention is illustrated in FIG. 1. Package 10 is illustrated without its metallic covering layer (usually formed from a combination of iron, nickel and cobalt, distributed under the tradename Kovar, and hermetically sealed to the top of the package) to clearly illustrate internal cavity 12 and the interrelationship of the various ceramic layers. It is to be noted at this point that throughout the course of the present discussion, the various layers will be referred to as "ceramic layers". However, any electrically nonconductive material (for example, glass, silicon dioxide, etc.) may be used to form the package of the present invention. Other materials may also be used, for example, plastic, if package hermeticity is not required.

To be used as a housing for an optical transmitter, package 10 of the present invention requires an opening 14 for the later attachment of an optical fiber (not shown), which is usually connected to such a package by a flange hermetically sealed to the package. The dimensions of opening 14 are determined in accordance with the present invention by providing various ceramic layers of predetermined thicknesses which have cut-out portions to allow the fiber to enter the package. In particular, a first ceramic layer 16 of package 10 is determined to have a height H which defines the bottom of opening 14. Ceramic layers 18, 20, and 22 are stacked on first ceramic layer 16 and together comprise a height D which defines the top of opening 14. Each of ceramic layers 18, 20 and 22 include a cut-out portion, or opening, as can be seen by reference to FIG. 1, which defines the width of opening 14.

It is well-known that, high frequency signal sources exhibit an impedance Z. In order to provide optimum transmitter performance, this impedance Z should be as closely matched as possible to the transmitting optical device. However, laser devices generally used in this application are known to have a impedance much smaller than the value Z associated with high frequency signal sources. Our copending patent application Ser. No. 792,056 discloses an arrangement for increasing the impedance as seen looking from signal source to the laser to overcome this problem. However, it is equally important to maintain this impedance Z along the transmission path between the signal source and optical device. For high frequency applications, as stated above, parasitic inductances associated with the wire bonds and long lead lengths of conventional packages seriously affect this impedance value. Therefore, in accordance with the present invention these conventional connections are replaced by a multilayer microwave input connection for example, a microstrip, between the high frequency signal source and the optical device (the optical device being, for example, a p-n junction laser diode or an edge-emitting LED).

In accordance with the present invention, it is to be understood that various other multilayer microwave connection arrangements may be utilized in place of the specific microstrip arrangement illustrated in the present figures. In particular, a microwave stripline connection may also be utilized, where such an arrangement comprises a pair of parallel ground plates separated by a thickness of dielectric material and a conductor centrally disposed through the dielectric material. Various other arrangements may also be used and are well-known to those skilled in the design of microwave circuits. Therefore, during the course of the present discussion, any other multilayer microwave connection may be substituted for the microstrip input connection. Referring to FIG. 1, a microstrip 1 includes a metallic conductor 32 formed on the top surface of ceramic layer 20. The ground plane of microstrip 1 is formed by a metallic layer 30 located on the underside of ceramic layer 20. Metallic conductor 32 may be formed using a standard metal film deposit on top of layer 20, where the metal film is deposited to be coextensive with a portion of the ground plane. As seen by reference to FIG. 1, microstrip 1 is formed to be accessible from a side of ceramic package 10. In order to facilitate the connection of the ground plane to the optical devices, the top of ceramic layer 18 may be metallized to contact the ground plane when layers 18 and 20 are joined, where this additional metallization is shown in FIG. 2. This allows for the ground plane wire bond to be made to the top surface of a ceramic layer, instead of needing to contact the underside of layer 20. It is to be understood, however, that either type of connection may be used in practicing the present invention. Referring to FIG. 1, ceramic layer 22 merely acts as a spacer to provide the additional height S required to determine the top of opening 14. The final ceramic layer 24 is disposed over layer 22 and functions to provide the top level of opening 14. The thickness of layer 24 is determined by the total height desired for package 10.

Package 10 of the present invention also includes a plurality of conductors 25, disposed as shown in FIG. 1, to provide conventional electrical connections between devices included in package 10 and required external components—monitors, power sources, d.c. bias supplies, etc. For example, one or more of these connectors could be used to provide a low bit rate input signal to an optical device included in package 10. Other connectors could be connected to a thermoelectric cooler (TEC) which is a standard component of laser packages used to prevent the laser from overheating and malfunctioning. Temperature sensors or monitors may also be connected. As can be seen, an advantage of package 10 of the present invention is its versatility in being able to handle either high frequency or low frequency input signals. In order to facilitate the manufacture of package 10, electrical conductors 25 may be formed on the top surface of either layer 18 or 20, since these two layers must go through a metallization operation to form the metal regions required for microstrip input 1. In the illustration of FIG. 1, electrical conductors 25 are illustrated as being formed on the top of ceramic layer 18. It is to be noted, however, conductors 25 may be formed at any suitable location and, in fact, separate ones of these conductors may extend from different faces of package 10, if such a formation facilitates connection to the various external components.

FIG. 2 illustrates a cut-away side view of package 10, taken along line 2—2 of FIG. 1. This side view illustrates an additional layer 26, referred to as the base layer. Base layer 26 is used as a common thermal path, or heat sink, for the package. Layer 26 may comprise beryllia (BeO), a combination of tungsten and copper, or any other material which has a low thermal impedance. Of course, for a hermetic package, it is necessary that the material used for layer 26 will form a hermetic bond when attached to ceramic layer 16. The formation of microstrip 1 input is quite evident from the view of FIG. 2. As shown, ceramic layer 18 includes a top metallized portion 28 which forms the package ground plane where as stated above the inclusion of metallized layer 28 facilitates wire bond connections. Metal film deposit 32 is formed on top of ceramic layer 20 to define the microstrip conductor.

FIG. 3 contains another view of microstrip input 1, illustrating the various dimensions of the components forming an exemplary microstrip input 1. As previously discussed, other various multilayer microwave connections, for example, a stripline, may also be used. Referring to FIG. 3, the dimensions of microstrip 1 are chosen to provide the desired impedance match between the input high frequency signal source and the optical device. In the exemplary arrangement illustrated in FIG. 3, ceramic layer 20 comprises alumina ($Al_2O_3$) which has a relative permittivity $\epsilon_r$ in the range of 9 to 9.5, depending on the purity of the alumina, and a relative permeability, $\mu_r$, of 1.0. These values of $\epsilon_r$ and $\mu_r$ are used in conjunction with the desired characteristic impedance $Z_1$ to determine the thickness d of ceramic layer 20 and width w of metal conductor 32. From electromagnetic field theory, the capacitance $C_1$ of microstrip 1 is defined by the equation $$c_1 \simeq (\epsilon/d). \qquad (1)$$

The inductance $l_1$ of microstrip 1 being defined by $$l_1 \simeq \mu(d/w), \qquad (2)$$

where $\epsilon$ and $\mu$ are the absolute permittivity and permeability, respectively. Therefore, the characteristic impedance of $Z_1$ of microstrip 1 can be approximated by the expression $$Z_1 \simeq \sqrt{l_1/c_1}. \qquad (3)$$

Thus, for a given value of $Z_1$, equations (1)–(3) may be solved for d and w, given $\mu$ and $\epsilon$.

Figure 4:
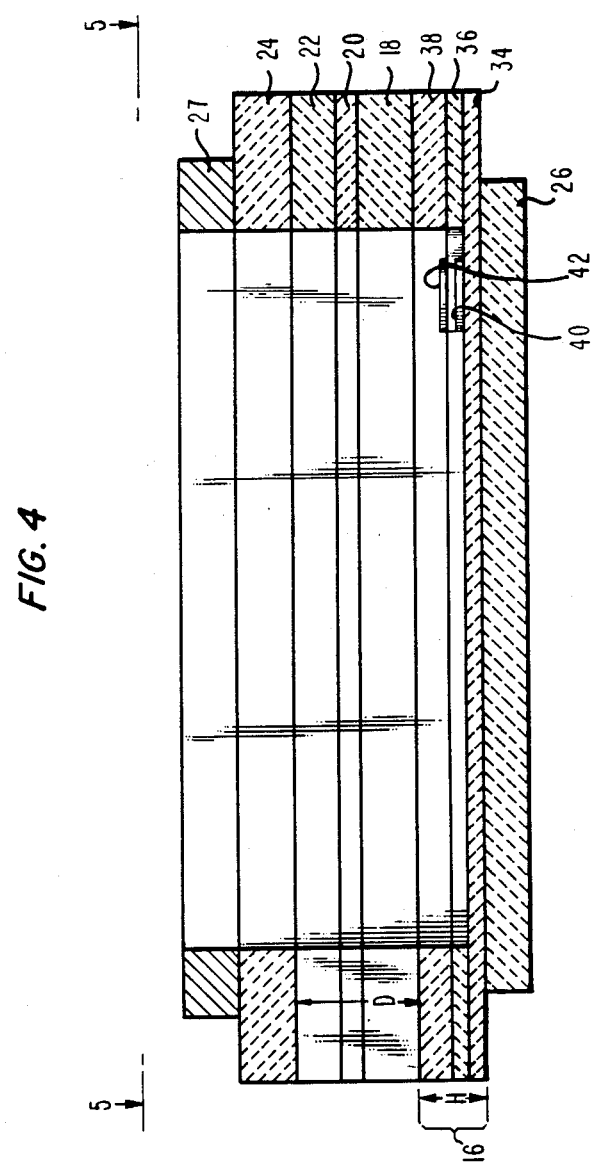
FIG. 4 is alternative cut-away view of the package of FIG. 1, taken along line 4—4 of FIG. 1.

FIG. 4 illustrates an alternative view of an exemplary package 10, taken along line 4—4 of FIG. 1. In this view of package 10, first ceramic layer 16 is shown as comprising three separate layers 34, 36, and 38. Ceramic layer 34 is formed to have a top metallized portion 40 as shown. Similarly, ceramic layer 36 includes a metallized portion 42. These portions are used in an embodiment of the present invention to provide positive and negative connections to a thermoelectric cooler (TEC) used as described above in conjunction with a laser diode. Ceramic layer 38 is used merely as a spacer layer, to provide a composite ceramic layer 16 of the required height H. This three layer structure is merely a suggested embodiment of package 10 of the present invention, used to provide the TEC connections as described. Alternatively, both metallized portions 40 and 42 could be formed on separate portions of ceramic layer 34. Layer 36 could then be the spacer layer used to provide the correct height H, and layer 38 would not be needed. Further, if the arrangement does not require a TEC, a single ceramic layer 16, as shown in FIG. 1, would be sufficient to form the bottom structure of package 10. Various other modifications of first ceramic layer 16 may be utilized and are considered to fall within the scope of the present invention. A cut away view of a sealing layer 27 is also illustrated in FIG. 4. This sealing layer comprises a material which when attached to the ceramic layers will form a hermetic seal. As mentioned above, Kovar is a material which satisfies this requirement. Additionally, vias (small conductive paths) are included in the various ceramic layers so that sealing ring 27 may be connected to base plate 26, thus insuring that the entire package is completely grounded.

Figure 5:
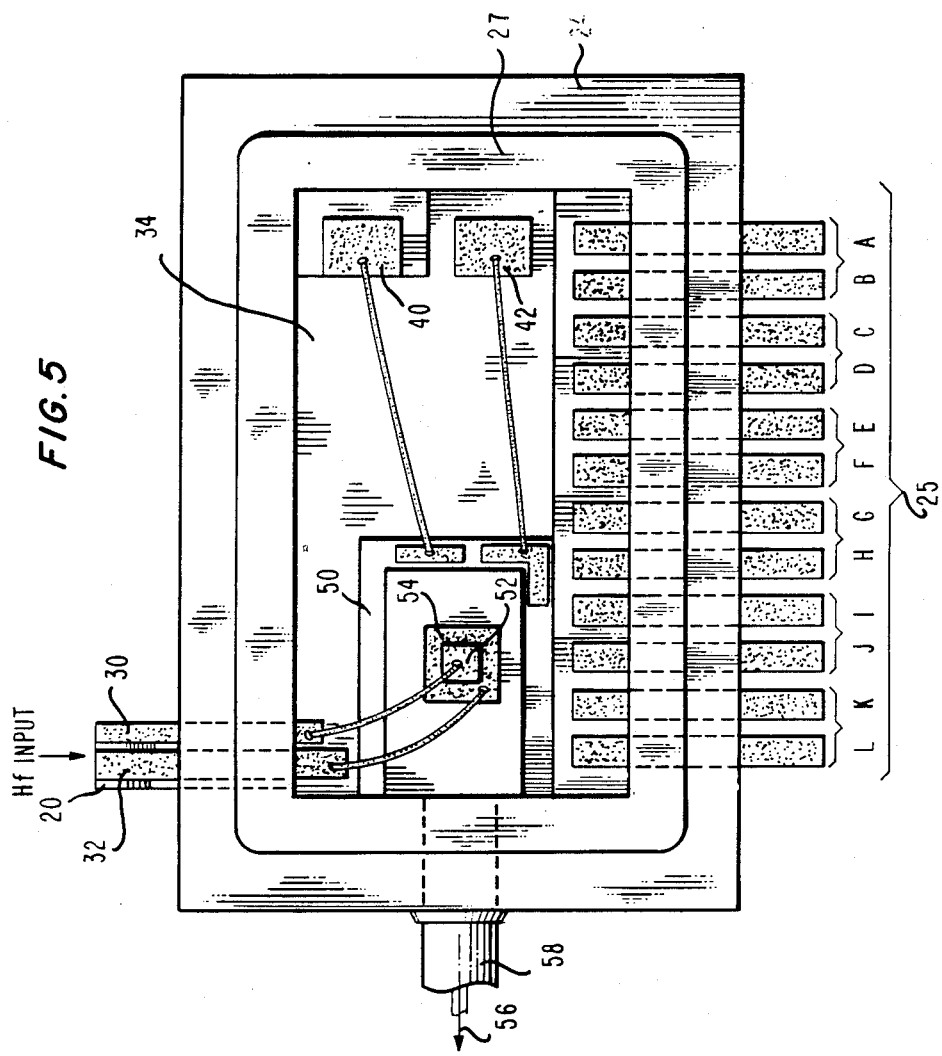
FIG. 5 is a top view of the package of the present invention, as taken along line 5—5 of FIG. 4, to illustrate an interconnection of the various inputs to an exemplary laser diode transmitter.

A top view in perspective of package 10, taken along line 5—5 of FIG. 4, is illustrated in FIG. 5. As shown, a thermoelectric cooler (TEC) 50 has been placed in package 10 and connected to both metallized regions 40 and 42. An exemplary p-n junction laser 52 is also illustrated as placed upon a submount 54. For the exemplary embodiment illustrated in FIG. 5, electrical connectors 25 are illustrated as including 12 separate conductors, denoted A–L. In particular, connectors A and B are used as the package ground connections between sealing layer 27 and base plate 26 as described above. Connectors C,D and E,F provide the external signal drive necessary to operate TEC 50, and are connected to TEC 50 via metal regions 40 and 42 with appropriate via holes. Connectors I,J, may be utilized to provide a low frequency input signal to laser diode 52. A backface monitor output from laser 52 may be passed through connectors G,H, and connectors K,L may be connected to a temperature sensor which may mounted on TEC 50. It is to be noted that these various connections are exemplary only, and various other arrangements of input connectors may be utilized in association with the multilayer ceramic package of the present invention. As illustrated in FIG. 5, the output from the laser passes through an optical fiber 56 which is connected to package 10 via a flange 58.

For many systems, it would be preferable to locate the laser drive circuitry and other related electronic components in the package with the light emitting device. For high bit rate applications in particular, such an arrangement, which allows the circuitry to be placed as close to the laser diode as possible, would provide a suitable impedance match by minimizing deleterious parasitic elements which may be present along longer transmission paths. Such a package also tends to be more universal in application as compared with conventional prior art packaging arrangements.

Figure 6:
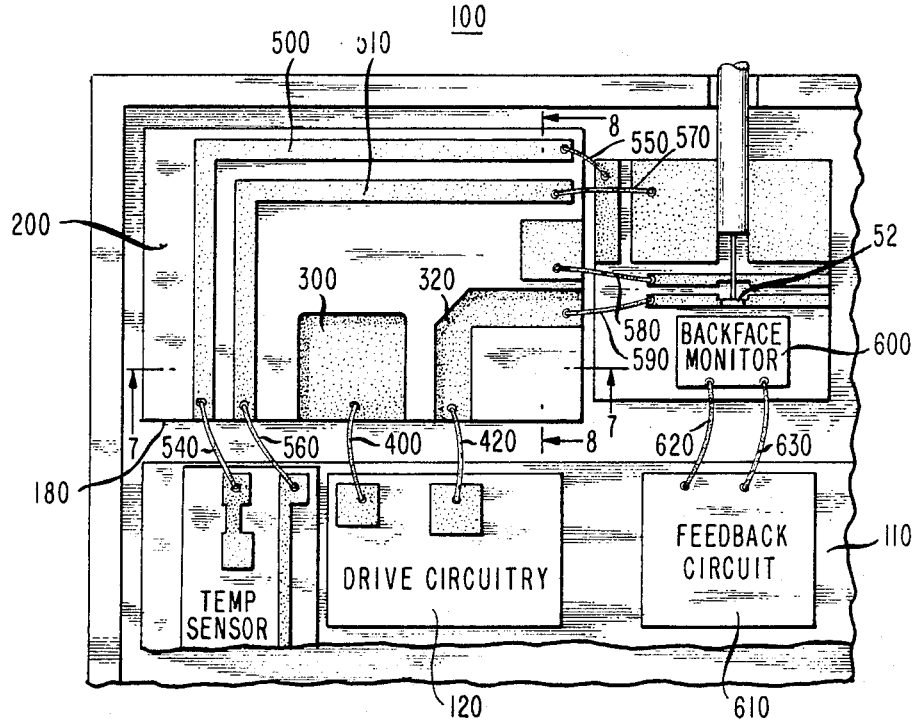
FIG. 6 illustrates an alternative multilayer ceramic package of the present invention which utilizes an internal microstrip connection 1' between the light emitting device and drive circuitry housed in the same package.

FIG. 6 illustrates a multilayer ceramic package 100 of the present invention which is a variant of that described above with an enlarged internal cavity of a sufficient size to house the laser drive circuitry and other related electronic components. The various circuits are formed on a ceramic substrate 110 which is located behind laser diode 52. Microstrip connection 1' between drive circuitry 120 and laser diode 52 comprises indented portions of ceramic layers 18 and 20 which have been metallized as described above to form a microstrip. In particular, indented portion 180 of ceramic layer 18 is covered by a metal layer 300 which is subsequently covered by indented portion 200 of ceramic layer 20. Openings 210 and 220 are formed in indented portion 200 to allow electrical interconnection accessibility (for example, by wire bonding) to metal layer 300. Microstrip 1' is completed by a metal layer 320 formed on ceramic portion 200 as shown. The field fringing effects associated with inner corner 322 of metal layer 320 are negated by cutting outer corner 324 in the manner shown in FIG. 6. A suitable resistive element 325 (shown illustratively with metal layer 320) may be inserted along either path between drive circuitry 120 and laser diode 52 so as to provide necessary impedance matching between these components. A pair of wire bonds 400,410 are used to couple a first input from drive circuitry 120 across microstrip 1' to laser diode 52. Similarly, a second pair of wire bonds 420,430 are used to couple the input of the opposite polarity.

The arrangement of package 100 also allows for connections to a backface monitor and temperature sensor to be included in the inner cavity of the package. In the exemplary arrangement of FIG. 6, metal strips 500,510 provide a connection between temperature sensing circuitry 520 located on ceramic substrate 110 next to drive circuitry 120 and a temperature sensor 530 located with laser diode 52. Wirebonds 540, 550, 560 and 570 are used to form this connection. Connections between a backface monitor 600 and feedback circuitry 610 are similarly provided by a pair of wire bonds 620,630.

In an alternative to using indented portions of ceramic layers 18 and 20, separate ceramic sections 180' and 200' may be used to form microstrip 1' for inclusion in package 100 of the present invention. For this embodiment, the layered structure formed by sections 180' and 200' with metal layers 300 and 320 is simply affixed to a convenient location inside package 100. For example, if drive circuitry 120 were to be located directly behind laser diode 52, microstrip 1' may be placed directly between ceramic substrate 110 and laser diode 52. In this case, metal layer 320 would simply comprise a straight piece of metal and corner cutting would not be necessary as is shown in FIG. 6. This alternative embodiment may be preferred for its ease of manufacturability. That is, a standard rectangular package may be used for various lightwave transmitter designs, with microstrip input 1' relocated inside the package in conjunction with different drive circuitry locations. In contrast, if indented portions of the package are used, the package manufacturing process must be re-tooled for each modification in microstrip placement.

Figure 7:
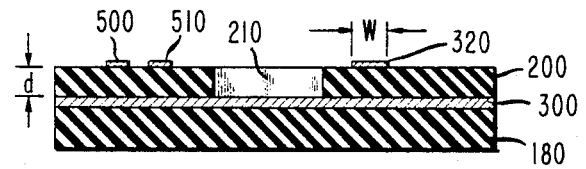
FIG. 7 is a cut-away view of microstrip 1' taken along line 7—7 of FIG. 6.
Figure 8:
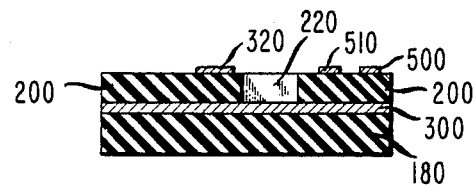
FIG. 8 is an alternative cut-away view of microstrip 1' taken along line 7—7 of FIG. 6.

FIG. 7 illustrates a view of microstrip 1' of package 100 taken along line 7—7 of FIG. 6. In this view, opening 210 required for connection of metal layer 300 to drive circuitry 120 is clearly shown. FIG. 8 illustrates a similar view, along line 8—8 of FIG. 6, illustrating opening 220 required to connect metal layer 300 to laser diode 52. Since ceramic portion 200 comprises the same relative permittivity $\epsilon_r$ and relative permeability $\mu_r$ as ceramic layer 20, equations (1)-(3) defined above can be used to determine the depth d of ceramic portion 200 and width w of metal layer 320 which are required to provide the correct matching impedance for microstrip 1'.

What is claimed is:

1. A package for semiconductor optical communication devices comprising an electrically nonconductive housing having an opening for allowing insertion of an optical transmission fiber and including a multilayer microwave transmission line for providing a connection between a high bit rate input signal source and said semiconductor optical communication devices.

2. A package for optical devices as defined in claim 1 wherein the multilayer microwave transmission line is a microstrip transmission line.

3. A package as defined in claim 1 wherein the housing further includes a plurality of electrical conductors for providing means of connecting external components to the optical devices and additional monitoring devices located within said package.

4. A package as defined in claims 1, 2, or 3 wherein said package further comprises
 a bottom support plate disposed in contact with the bottom of the housing, said bottom plate being of a material with a relatively low thermal impedance to provide a heat sink for said package; and
 a top sealing plate disposed in contact with the top of said housing, said top plate being of conductive material and connected to said bottom support plate through said housing to provide an electrical ground for said package.

5. A package as defined in claim 2 wherein the electrically nonconductive housing includes a plurality of separate layers of nonconductive material, each layer being defined as having a top and a bottom major surface, the microstrip input connection being formed by a specific layer from said plurality of layers which comprises a predetermined thickness d and is metallized along a predetermined portion of its bottom major surface to form a ground plane and includes a metal deposit of a predetermined width w on its top major surface to form a conductor.

6. A package as defined in claim 5 wherein the plurality of separate layers comprises
 a first electrically nonconductive layer (16) of a predetermined thickness (H) and having a central cavity region;
 a second electrically nonconductive layer (18) disposed on top of said first layer and having a central cavity region, said second layer including a sidewall opening of a predetermined width;
 a third electrically nonconductive layer (20) disposed on top of said second layer, said third layer having a central cavity region and including a sidewall opening of said predetermined width, said sidewall opening coinciding with the sidewall opening in said second layer, said third layer being of a predetermined thickness (d) required for providing the microstrip transmission line connection of a predetermined characteristics impedance, the third layer being defined as the specific layer which includes the bottom ground plane and top metal conductor, the width w of said metal conductor being of a value to provide said predetermined characteristic impedance;

a fourth electrically nonconductive layer (22) disposed on top of said third layer and having a central cavity region, said fourth layer including a sidewall opening of said predetermined width aligned with said sidewall openings in said second and third layers, said fourth layer comprising a predetermined height (S) such that the combined heights of said second, third, and fourth layers are equal to a predetermined height D required for the optical communication fiber opening; and a fifth electrically nonconductive layer (24) disposed on top of said fourth layer and having a central cavity region, said fifth layer comprising a sufficient height so that said housing comprises a predetermined height.

7. A package for optical devices as defined in claim 6 wherein the second electrically nonconductive layer is metallized along a portion of the top surface thereof so as to contact the bottom ground plane of the third layer when said third layer is disposed in contact with said second layer.

8. A package for optical devices as defined in claim 1, wherein said electrically nonconductive material is a ceramic.

9. A package for optical devices as defined in claim 8, wherein the ceramic is aluminum oxide.

10. A hermetic package for semiconductor optical communication devices comprising an electrically nonconductive housing having an opening for allowing insertion of an optical transmission fiber and including a multilayer microwave transmission line for providing a connection between a high bit rate input signal source and said semiconductor optical communication devices, wherein the material forming said electrically nonconductive housing is capable of providing a hermetic seal when sintered at an elevated temperature.

11. A hermetic package for optical devices as defined in claim 10 wherein the multilayer microwave transmission line is a microstrip transmission line.

12. A hermetic package for optical devices as defined in claim 10 wherein the package further comprises a plurality of electrical conductors for providing means of connecting external components to the optical devices and additional monitoring devices located within said package.

13. A hermetic package for optical devices as defined in claims 10, 11 or 12 wherein the package further comprises
a bottom support plate disposed in contact with the bottom of the housing, said bottom support plate being of a material with a relatively low thermal impedance to provide a heat sink for said hermetic package; and
a top sealing plate disposed in contact with the top of said housing, said top plate being of conductive material and connected through said housing to provide an electrical ground for said package, said bottom support plate and said top sealing plate comprising materials which when brazed are capable of forming a hermetic seal with said housing.

14. A hermetic package as defined in claim 13 wherein the bottom support layer comprises beryllia and the top sealing layer comprises a combination of iron, nickel and cobalt.

15. A hermetic package as defined in claim 13 wherein the bottom support layer comprises a combination of tungsten and copper and the top sealing layer comprises a combination of iron, nickel and cobalt.

16. A hermetic package as defined in claim 13 wherein the housing comprises a ceramic material.

17. A hermetic package as defined in claim 16 wherein the ceramic material is aluminum oxide.

18. A multilayer package for semiconductor optical communication devices comprising
a plurality of separate layers of ceramic material disposed in a stacked configuration to define a multilayer ceramic housing having an opening for allowing insertion of an optical transmission fiber and including an internal cavity region for mounting the semiconductor optical communication devices;
a bottom thermally conductive layer disposed underneath and in contact with said multilayer ceramic housing;
a top ground plane layer disposed on top of and in contact with said multilayer ceramic housing; and
a multilayer microwave transmission path disposed through a portion of said multilayer ceramic housing with a first terminal connection external said housing and a second terminal connection in the internal cavity region of said housing, said first terminal for connection to an external power supply and said second terminal for connection to a semiconductor optical communication device mounted in said internal cavity, wherein said multilayer microwave transmission path provides a microwave transmission connection between said external power supply and said optical device.

19. A multilayer package as defined in claim 18 wherein the multilayer microwave transmission path comprises a microstrip transmission path.

20. A multilayer package as defined in claim 19 wherein the microstrip transmission path comprises
a first ceramic layer of the plurality of ceramic layers defining the multilayer ceramic housing, said first ceramic layer having a predetermined permittivity $\epsilon_r$ and a predetermined permeability $\mu_r$ and comprised to have a predetermined thickness d
a ground plane metal layer formed on a portion of a bottom major surface of said first ceramic layer; and
a top metal conductor formed on a portion of the top major surface of said first ceramic layer so as to be longitudinally coextensive with a portion of said ground plane metal layer, said top metal conductor comprising a predetermined width w, wherein the impedance of the microstrip transmission path is approximately equal to the quantity $(\mu/\epsilon)^{\frac{1}{2}}(d/w)$.

21. An optical transmitter including a semiconductor optical transmitting device and means for driving said semiconductor optical transmitting device, both said semiconductor optical transmitting device and said driving means being housed in an electrically nonconductive package having an opening for allowing insertion of an optical transmission fiber and including a multilayer microwave connection between said driving means and said semiconductor optical transmitting device.

22. An optical transmitter as defined in claim 21 wherein the electrically nonconductive package comprises a ceramic.

23. An optical transmitter as defined in claim 22 wherein the ceramic is aluminum oxide.

24. An optical transmitter as defined in claim 21 wherein the multilayer microwave connection comprises a microstrip connected between the driving means and the optical transmitting device.

25. An optical transmitter as defined in claim 24 wherein the microstrip comprises
   a layer of nonconductive material of a predetermined thickness d and having a relative permittivity $\epsilon_r$ and a relative permeability $\mu_r$;
   a first metal layer disposed underneath said nonconductive layer to form the ground plane for said microstrip; and
   a second metal layer of a predetermined width w disposed on top of said nonconductive layer, wherein the impedance of said microstrip is approximately equal to the quantity $(\mu_r/\epsilon_r)^{\frac{1}{2}}(d/w)$.

26. An optical transmitter as defined in claim 25 wherein the electrically nonconductive material is a ceramic.

27. An optical transmitter as defined in claim 26 wherein the ceramic is aluminum oxide.

28. An optical transmitter as defined in claim 25 wherein the layer of nonconductive material comprises an indented portion of one layer of the multilayer package.

29. An optical transmitter as defined in claim 28 wherein the nonconductive material is a ceramic.

30. An optical transmitter as defined in claim 29 wherein the ceramic is aluminum oxide.

31. An optical transmitter as defined in claim 25 wherein the layer of nonconductive material comprises a separate piece of nonconductive material which is affixed to an internal region of the electrically nonconductive package.

32. An optical transmitter as defined in claim 31 wherein the nonconductive material is a ceramic.

33. An optical transmitter as defined in claim 32 wherein the ceramic is aluminum oxide.

34. An optical transmitter as defined in claim 21 wherein the multilayer microwave connection further includes impedance matching means.

35. An optical transmitter including a semiconductor optical transmitting device and means for driving said semiconductor optical transmitting device, both said semiconductor optical transmitting device and said driving means being housed in an electrically nonconductive hermetic package having an opening for allowing insertion of an optical transmission fiber and including a multilayer microwave connection between said semiconductor optical transmitting device and said driving means, wherein the material forming the electrically nonconductive package is capable of providing a hermetic seal when sintered at an elevated temperature.

36. An optical transmitter as defined in claim 35 wherein the electrically nonconductive package comprises a ceramic.

37. An optical transmitter as defined in claim 36 wherein the ceramic is aluminum oxide.

38. An optical transmitter as defined in claim 35 wherein the multilayer microwave connection comprises a microstrip connected between the driving means and the optical transmitting device.

39. An optical transmitter as defined in claim 38 wherein the microstrip signal path comprises
   a layer of nonconductive material of a predetermined thickness d and having a relative permittivity $\epsilon_r$ and a relative permeability $\mu_r$;
   a first metal layer disposed underneath said nonconductive layer to form the ground plane for said microstrip; and
   a second metal layer of a predetermined width w disposed on top of said nonconductive layer, wherein the impedance of said microstrip is approximately equal to the quantity $(\mu_r/\epsilon_r)^{\frac{1}{2}}(d/w)$.

40. An optical transmitter as defined in claim 39 wherein the electrically nonconductive material is a ceramic.

41. An optical transmitter as defined in claim 40 wherein the ceramic is aluminum oxide.

42. An optical transmitter as defined in claim 39 wherein the layer of nonconductive material comprises an indented portion of one layer of the multilayer package.

43. An optical transmitter as defined in claim 42 wherein the nonconductive material is a ceramic.

44. An optical transmitter as defined in claim 43 wherein the ceramic is aluminum oxide.

45. An optical transmitter as defined in claim 39 wherein the layer of nonconductive material comprises a separate piece of nonconductive material which is affixed to an internal region of the electrically nonconductive package.

46. An optical transmitter as defined in claim 45 wherein the nonconductive material is a ceramic.

47. An optical transmitter as defined in claim 46 wherein the ceramic is aluminum oxide.

48. An optical transmitter as defined in claim 35 wherein the multilayer microwave connection further includes impedance matching means.

* * * * *

UNITED STATES PATENT AND TRADEMARK OFFICE
Certificate

Patent No. 4,873,566            Patented: Oct. 10, 1989

On petition requesting issuance of a certificate for correction of inventorship pursuant to 35 U.S.C. 256, it has been found that the above-identified patent, through error and without any deceptive intent, improperly sets forth the inventorship. Accordingly, it is hereby certified that the correct inventorship of this patent is:
Norman R. Dietrich, John L. Hokanson, Walter R. Holbrook, Anderson F. Johnson, Jr., Palmer D. Smeltz, Michael J. Yanushefski, Katherine A. Yanushefski, Craig A. Young and Alfred Zacharias.

Signed and Sealed this Twenty-ninth Day of October, 1991.

WILLIAM L. SIKES

*Supervisory Patent Examiner*
*Group Art Unit 251*